US012597587B2

(12) United States Patent
Huderi Somanna et al.

(10) Patent No.: US 12,597,587 B2
(45) Date of Patent: Apr. 7, 2026

(54) PROCESS CHAMBERS HAVING MULTIPLE COOLING PLATES

(71) Applicant: Applied Materials, Inc., Santa Clara, CA (US)

(72) Inventors: Dinkesh Huderi Somanna, San Jose, CA (US); Dan Deyo, Austin, TX (US); Vishwas Kumar Pandey, Bangalore (IN); Ala Moradian, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 310 days.

(21) Appl. No.: 18/208,736

(22) Filed: Jun. 12, 2023

(65) Prior Publication Data

US 2024/0412954 A1 Dec. 12, 2024

(51) Int. Cl.
| | |
|---|---|
| *H01J 37/32* | (2006.01) |
| *C23C 14/00* | (2006.01) |
| *C23C 14/35* | (2006.01) |
| *C23C 14/50* | (2006.01) |
| *C23C 14/54* | (2006.01) |

(52) U.S. Cl.
CPC .... *H01J 37/32522* (2013.01); *C23C 14/0036* (2013.01); *C23C 14/35* (2013.01); *C23C 14/50* (2013.01); *C23C 14/541* (2013.01); *H01J 2237/002* (2013.01); *H01J 2237/332* (2013.01)

(58) Field of Classification Search
CPC .......... H01J 37/32522; H01J 2237/002; H01J 2237/332; C23C 14/0036; C23C 14/35; C23C 14/50; C23C 14/541; C23C 14/081; C23C 14/564
See application file for complete search history.

(56) References Cited

U.S. PATENT DOCUMENTS

| 7,665,951 B2 | 2/2010 | Kurita et al. |
| 7,892,357 B2 | 2/2011 | Srivastava |

(Continued)

FOREIGN PATENT DOCUMENTS

| CN | 110094396 A | * | 8/2019 | ............ F16B 11/006 |
| CN | 211227309 U | * | 8/2020 | |
| JP | H11279791 A | * | 10/1999 | |

OTHER PUBLICATIONS

CN-211227309-U Translation (Year: 2020).*

(Continued)

*Primary Examiner* — Patrick S Ott

(74) *Attorney, Agent, or Firm* — Moser Taboada

(57) ABSTRACT

Embodiments of process chambers having cooling plate are provided herein. In some embodiments, a process chamber includes: a chamber body defining an interior volume therein, the chamber body having a view port side having an opening configured as a view port, a pump side having a pump port, and a shutter side opposite the view port side, wherein the port view side, the pump side, and the shutter side are all different sides of the chamber body; a first cooling plate coupled to the view port side and having one or more first coolant channels; a second cooling plate coupled to the pump side and having one or more second coolant channels; and a third cooling plate coupled to the shutter side and having one or more third coolant channels.

20 Claims, 7 Drawing Sheets

(56) References Cited

U.S. PATENT DOCUMENTS

| | | | |
|---|---|---|---|
| 2003/0205328 A1* | 11/2003 | Kinnard | C23C 16/45572 |
| | | | 118/724 |
| 2009/0000548 A1* | 1/2009 | Sohda | C23C 14/50 |
| | | | 118/712 |
| 2015/0228530 A1* | 8/2015 | Rohrmann | H01L 21/67115 |
| | | | 118/725 |
| 2021/0025048 A1 | 1/2021 | Lemer et al. | |
| 2023/0055006 A1* | 2/2023 | Han | H01J 37/3408 |
| 2023/0108280 A1 | 4/2023 | Bhatt et al. | |
| 2023/0260761 A1 | 8/2023 | Choi et al. | |
| 2025/0132120 A1* | 4/2025 | Reifsnyder | F25B 21/04 |

OTHER PUBLICATIONS

CN-110094396-A Translation (Year: 2019).*
JP-H11279791-A Translation (Year: 1999).*
International Search Report for PCT/US2024/033267, dated Sep. 20, 2024.

* cited by examiner

PROCESS CHAMBERS HAVING MULTIPLE COOLING PLATES

FIELD

Embodiments of the present disclosure generally relate to substrate processing equipment.

BACKGROUND

Sputtering, alternatively called physical vapor deposition (PVD), is used for the deposition of metals and other materials in the fabrication of semiconductor integrated circuits. Use of sputtering has been extended to depositing material layers onto the sidewalls of high aspect-ratio (HAR) holes or gaps such as vias or other vertical interconnect structures. However, the inventors have observed that when processing substrates, such as but not limited to 200 mm substrates, at high temperatures (e.g., >700 deg. C.), a chamber body temperature may become too high to touch and pump efficiency may be reduced, causing poor performance.

Accordingly, the inventors have provided embodiments of improved process chambers.

SUMMARY

Embodiments of process chambers having cooling plates are provided herein. In some embodiments, a process chamber includes: a chamber body defining an interior volume therein, the chamber body having a view port side having an opening configured as a view port, a pump side having a pump port, and a shutter side opposite the view port side, wherein the port view side, the pump side, and the shutter side are all different sides of the chamber body; a first cooling plate coupled to the view port side and having one or more first coolant channels; a second cooling plate coupled to the pump side and having one or more second coolant channels; and a third cooling plate coupled to the shutter side and having one or more third coolant channels.

In some embodiments, a process chamber includes: a chamber body defining an interior volume therein, the chamber body having a view port side having an opening configured as a view port, a pump side having a pump port, and a shutter side opposite the view port side, wherein the port view side, the pump side, and the shutter side are all different sides of the chamber body; a first cooling plate coupled to the view port side and having one or more first coolant channels and having a first conduit disposed therein; a second cooling plate coupled to the pump side and having one or more second coolant channels and having a second conduit disposed therein; and a third cooling plate coupled to the shutter side and having one or more third coolant channels and having a third conduit disposed therein, wherein the first conduit is fluidly coupled to the second conduit and the third conduit.

In some embodiments, a process chamber includes: a chamber body defining an interior volume therein, the chamber body having a view port side having an opening configured as a view port, a pump side having a pump port, and a shutter side opposite the view port side, wherein the port view side, the pump side, and the shutter side are all different sides of the chamber body; a first cooling plate coupled to the view port side and having one or more first coolant channels and having a first conduit disposed therein; a second cooling plate coupled to the pump side and having one or more second coolant channels and having a second conduit disposed therein; a third cooling plate coupled to the shutter side and having one or more third coolant channels and having a third conduit disposed therein, wherein the first conduit is fluidly coupled to the second conduit and the third conduit; a top plate coupled to an upper surface of the chamber body, wherein the top plate includes one or more coolant channels fluidly coupled to the first conduit; and a cryogenic pump coupled to the pump port.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
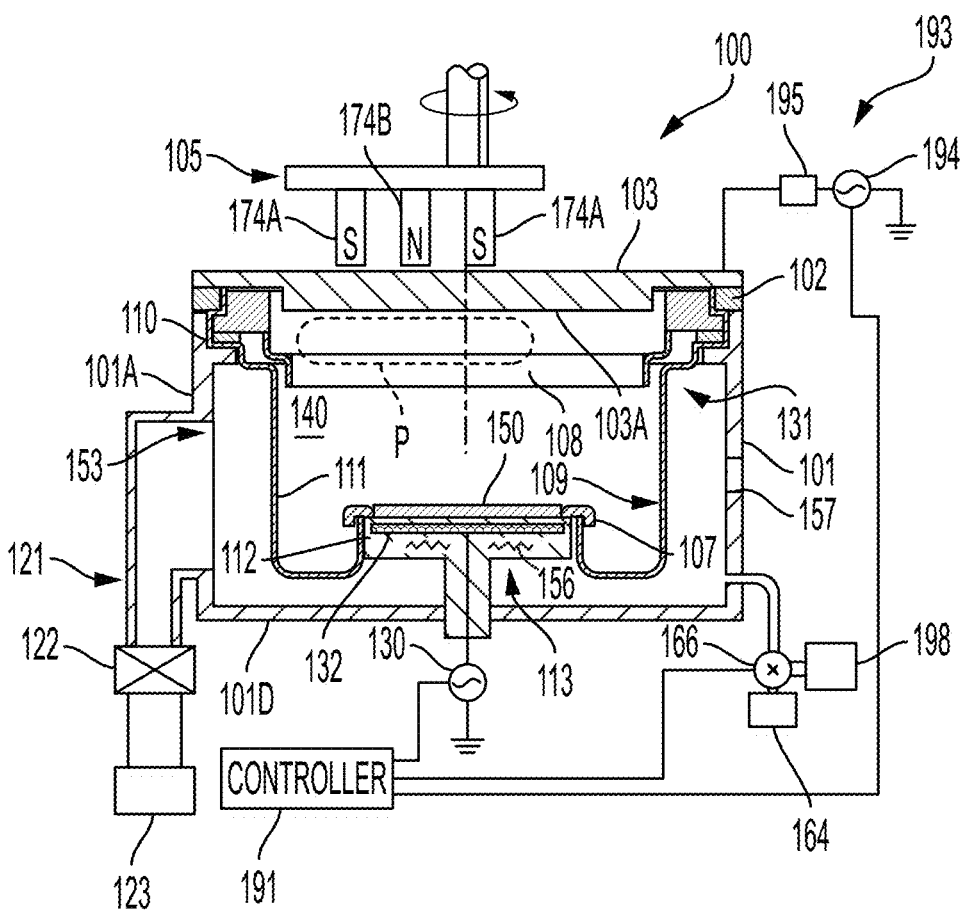
FIG. 1 depicts a schematic cross-sectional side view of a process chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of process chambers having cooling plates are provided herein. The process chamber may be a deposition chamber such as a physical vapor deposition (PVD) chamber. Conventional process chambers typically do not have any additional cooling mechanisms because a chamber body outer wall temperature is around or below 65 degrees Celsius. When conventional process chambers operate at elevated temperatures without additional cooling mechanisms, a chamber body temperature may exceed more than 100 degrees. Such elevated temperatures may present a danger to personnel operating the process chamber and may reduce efficiency of certain components of the process chamber, for example, a cryogenic pump. The process chamber includes a plurality of cooling plates coupled thereto to reduce the chamber body temperature during processing when an interior volume of the process chamber is heated to high temperatures.

The plurality of cooling plates are advantageously coupled to multiple sides of the chamber body to suitably cool the chamber body while maintaining access for ports, conduits, gas supplies, power supplies, and the like. The cooling plates generally include channels or conduits disposed therein to flow a coolant therethrough. The channels or conduits of each of the cooling plates may be separate for independent temperature control of each cooling plate, or the channels or conduits of all of the cooling plates may be fluidly coupled. In some embodiments, the channels may be in the form of slots or grooves configured to accommodate conduits disposed therein. In some embodiments, the channels may be drilled or otherwise formed within the cooling plates so that coolant can flow through the channels without any additional conduits disposed therein. A gasket advantageously may be disposed between the plurality of cooling plates and the chamber body to enhance thermal conductance. The plurality of cooling plates advantageously maintain an outer wall of the chamber body at a temperature of less than about 100 degrees Celsius, for example, less than 60 degrees Celsius.

FIG. 1 depicts a schematic cross-sectional side view of a process chamber 100 in accordance with at least some embodiments of the present disclosure. The process chamber 100 is shown as a PVD chamber, however, the cooling plates described herein may be used with any suitable chamber for semiconductor processing. The process chamber 100 generally includes a chamber body 101 defining an interior volume 140 therein. A target 103 is disposed in the interior volume 140 opposite a substrate support 113 configured to support a substrate 150 for processing. A process kit 131 may be disposed in the interior volume 140 about the substrate support 113 to prevent unwanted deposits on chamber walls and other chamber components. The chamber body 101 supports the target 103. In some embodiments, the target 103 is sealed at one end of the chamber body 101 through a target isolator 102 using a plurality of o-rings. The target 103 has at least a surface portion composed of material to be sputter deposited on the substrate 150 disposed on the substrate support 113. The chamber body 101 includes a substrate transfer opening 157 to facilitate transferring the substrate 150 into and out of the interior volume 140. In some embodiments, the substrate transfer opening 157 is disposed on a side of the chamber body 101 opposite the pump port 153.

A magnetron 105 may be disposed atop the target 103. The magnetron 105, which is disposed adjacent to and rotated relative to the target 103, includes a plurality of magnets 174A-174B that are used to confine a plasma P generated in the interior volume 140 by biasing the target 103 using a power source 193 to "sputter" material from the target surface 103A. The magnetron 105 may be any suitable type of magnetron for the particular process being performed on the substrate 150. The power source 193 generally comprises a power supply 194 that is configured to deliver DC and/or RF power to the target 103. In some RF power delivery configurations, the power source 193 may also include a match 195.

A pump assembly 121 is coupled to the chamber body 101 via a pump port 153 disposed on a pump side 101A of the chamber body 101. In some embodiments, the pump side 101A is disposed on a sidewall of the chamber body 101. In some embodiments, the pump side 101A may be a bottom wall 101D of the chamber body 101. The pump assembly 121 generally comprises a pump 123 and a valve 122 disposed between the pump 123 and the pump port 153. In some embodiments, the pump 123 is a cryopump. In some embodiments, the pump 123 comprises a cryopump and roughing pumps that are used to maintain a desirable pressure in the interior volume 140.

In some embodiments, the substrate support 113 comprises an electrostatic chuck 112 that has a supporting surface that is adapted to support the substrate 150 over one or more electrodes 132. The one or more electrodes 132 may be chucking electrodes. Alternatively, the substrate support 113 may have other suitable holding mechanisms for holding the substrate 150, such as vacuum chucking, clamping, or the like. One or more heating elements 156, cooling channels (not shown), and a thermal transfer gas cavities (not shown) may be formed in the substrate support 113 to provide thermal control of the substrate 150 during processing. The one or more heating elements 156 may be configured to heat the substrate support 113 to 700 degrees Celsius or higher during a physical vapor deposition (PVD) process. In some applications, the one or more electrodes 132, which are coupled to a power source 130, may apply an RF and/or a DC bias to the substrate 150 to attract the plasma P and process gases.

In some embodiments, the process kit 131 includes a cover ring 107 disposed about the substrate support 113. In some embodiments, the process kit 131 includes one or more chamber shields 109 generally disposed about a processing volume disposed between the target 103 and the substrate support 113. While only one chamber shield is shown in FIG. 1, the one or more chamber shields 109 may be more than one shield, depending on, for example, an operating temperature. The one or more chamber shields 109 may be used to reduce a temperature of the chamber body 101 by shielding the chamber body 101 from radiation originating from the processing region. In some embodiments, the process kit 131 includes a darkspace shield 108 that may be separated from the one or more chamber shields 109 by a second dielectric shield isolator 110. The process kit 131 parts are positioned within the process chamber 100 to protect the chamber walls from unwanted deposits. In some embodiments, the darkspace shield 108 is permitted to float electrically and the one or more chamber shields 109 is electrically grounded. However, in some embodiments, either or both shields may be grounded, floating or biased to the same or different nonground levels. The one or more chamber shields 109 and the darkspace shield 108 are typically composed of a metal such as stainless steel, and inner sides (e.g., inner surface 111) of the darkspace shield 108 may be bead-blasted or otherwise roughened to promote adhesion of the material sputter deposited on them.

In use, the substrate 150 may be biased to attract or repel ions generated in the formed plasma P as appropriate for that application. For example, a power source 130 may be provided to apply RF power to the one or more electrodes 132 to bias the substrate 150 to attract target material ions during the deposition process. In addition, the power source 130 may be configured to apply RF power to the one or more electrodes 132 to couple supplemental energy to the plasma. If the power source 130, used to bias the substrate 150, is an RF power supply, the supply may operate at a suitable frequency, such as 13.56 MHz. A computer-based controller 191 may be programmed to control the power levels, voltages, currents, and frequencies of the various sources in accordance with the particular application.

A gas source 164 supplies a sputtering working gas, such as, for example, a chemically inactive noble gas, such as argon, to the interior volume 140 through a mass flow controller 166. The working gas can be admitted to the top of the chamber or, as illustrated, at a bottom of the chamber, either with one or more inlet pipes penetrating apertures through the bottom of the one or more chamber shields 109 or through a gap between the one or more chamber shields 109 and the substrate support 113. During reactive PVD processes a nitrogen gas may be delivered from a source 198 to form a nitride containing layer, such as aluminum nitride, on the substrate 150.

Figure 2:
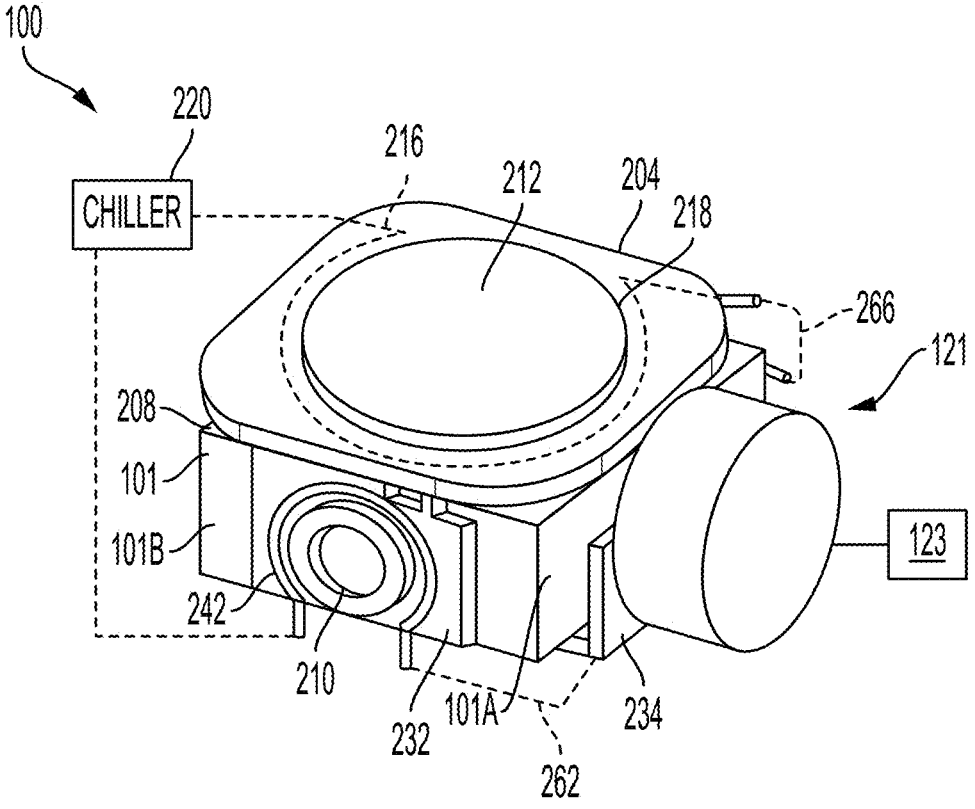
FIG. 2 depicts a schematic top isometric view of a process chamber in accordance with at least some embodiments of the present disclosure.
Figure 3:
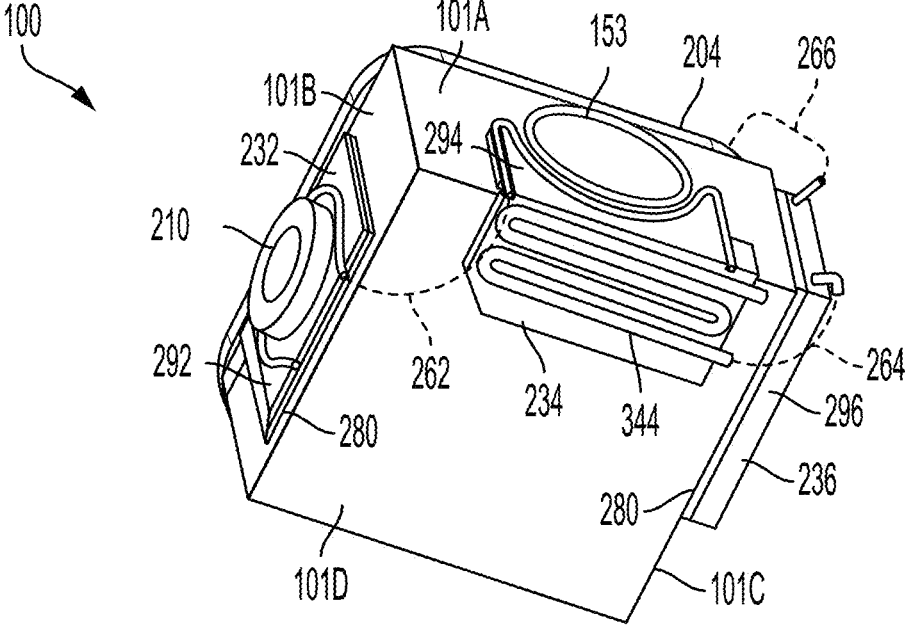
FIG. 3 depicts a schematic bottom isometric view of a process chamber in accordance with at least some embodiments of the present disclosure.

FIG. 2 depicts a schematic top isometric view of a process chamber 100 in accordance with at least some embodiments of the present disclosure. FIG. 3 depicts a schematic bottom isometric view of a process chamber 100 in accordance with at least some embodiments of the present disclosure. The chamber body 101 includes a view port side 101B having an opening 210 configured as a view port to view the interior volume 140 from outside the chamber body 101. In some embodiments, the view port side 101B is adjacent the pump side 101A. The chamber body 101 includes a shutter side 101C having a shutter opening configured for gaining access to the interior volume 140 from the shutter side 101C. In some embodiments, the shutter side 101C is disposed opposite the view port side 101B. The view port side 101B, the pump side 101A, and the shutter side 101C are all different sides of the chamber body 101.

A top plate 204 is coupled to an upper surface 208 of the chamber body 101. The top plate 204 may include a central opening 218 for top access to the interior volume 140. In some embodiments, the top plate 204 includes one or more coolant channels 216 disposed therein (shown in phantom lines in FIG. 2) arranged in a suitable pattern about the central opening 218. The one or more coolant channels 216 may be coupled to a chiller 220 configured to circulate a coolant through the one or more coolant channels 216. In some embodiments, the coolant comprises water, or the like. A lid 212 may be disposed atop the top plate 204 to close the central opening 218.

Figure 5:
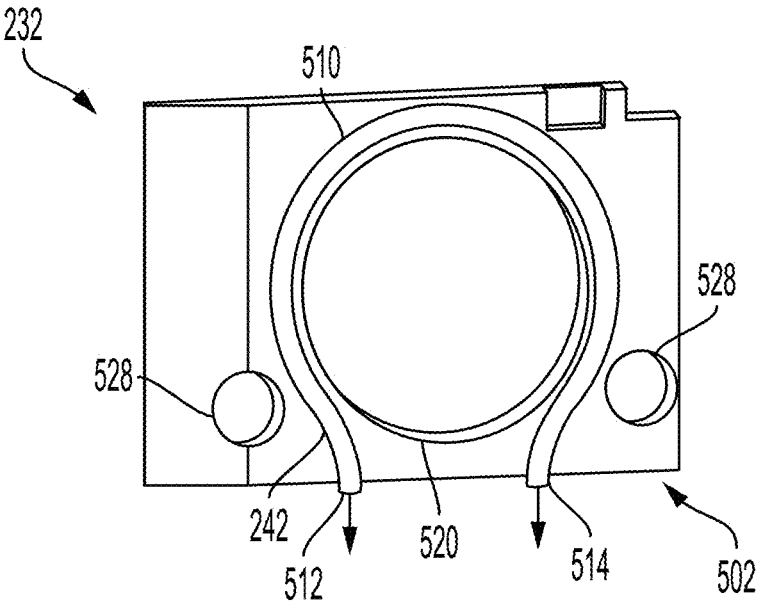
FIG. 5 depicts an isometric view of a first cooling plate in accordance with at least some embodiments of the present disclosure.

A first cooling plate 232 is coupled to the view port side 101B and includes one or more first coolant channels 242. FIG. 5 depicts an isometric view of the first cooling plate 232 in accordance with at least some embodiments of the present disclosure. In some embodiments, as shown in FIG. 5, the first cooling plate 232 includes a conduit 510 disposed in the one or more first coolant channels 242. The conduit 510 may be press fit or otherwise coupled or held within the one or more first coolant channels 242. In some embodiments, the one or more first coolant channels 242 may be enclosed within the first cooling plate 232 and the conduit 510 may or may not be needed. The one or more first coolant channels 242 generally extend substantially about a port opening 520 formed in the first cooling plate 232 to accommodate the opening 210 for the view port. The conduit 510 may be made of copper or any other suitable material.

Figure 7:
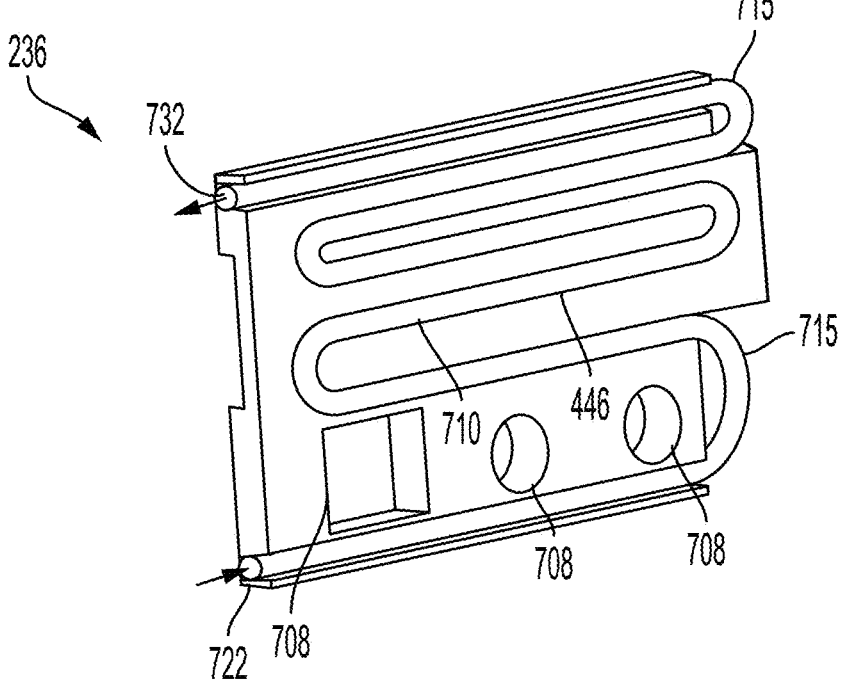
FIG. 7 depicts an isometric view of a third cooling plate in accordance with at least some embodiments of the present disclosure.

In some embodiments, the one or more first coolant channels 242 define an inlet 512 at one end and an outlet 514 at a second end for circulating a coolant therethrough. In some embodiments, the inlet 512 and the outlet 514 are disposed along a same side of the first cooling plate 232. For example, as shown in FIG. 7, the inlet 512 and the outlet 514 are disposed along a lower end 502 of the first cooling plate 232. In some embodiments, the inlet 512 and the outlet 514 are reversed. In some embodiments, the first cooling plate 232 includes one or more openings 528 for access to chamber body connections, for example, gas supplies, power supplies, or the like.

Figure 8:
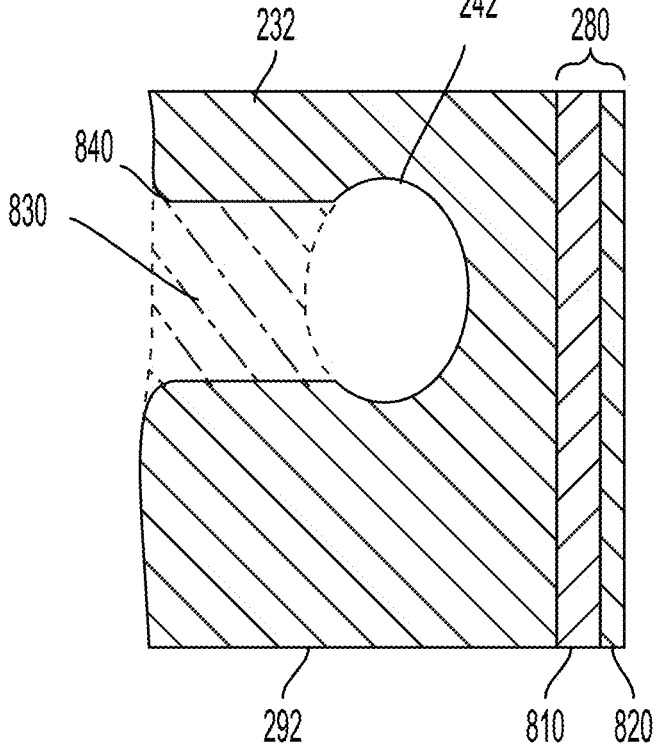
FIG. 8 depicts a cross-sectional side view of a portion of a first cooling plate in accordance with at least some embodiments of the present disclosure.

In some embodiments, the first cooling plate 232 may include one or more first coolant channels 242 that are enclosed and configured to flow a coolant therethrough without the conduit 510 (see FIG. 8 for example). For example, the one or more first coolant channels 242 may be drilled into the cooling plate to form a suitable flow path. Drilling may comprise making holes through one or more sidewalls of the first cooling plate 232 such that the holes intersect within the first cooling plate 232 to form a desired flow path. Drill hole openings along the sidewalls that are not the inlet 512 or the outlet 514 may be sealed via a plug or the like. The one or more first coolant channels 242 that are enclosed may be formed via other suitable methods, such as machined in a first plate and then bonded to a second plate to enclose the channels.

Figure 6:
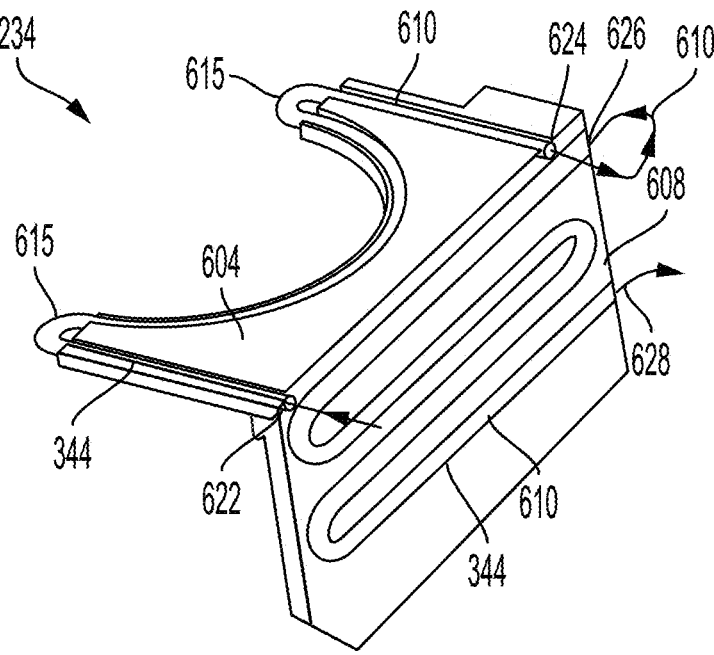
FIG. 6 depicts an isometric view of a second cooling plate in accordance with at least some embodiments of the present disclosure.

Returning back to FIGS. 2 and 3, a second cooling plate 234 is coupled to the pump side 101A and includes one or more second coolant channels 344. A third cooling plate 236 is coupled to the shutter side 101C. FIG. 6 depicts an isometric view of the second cooling plate 234 in accordance with at least some embodiments of the present disclosure. In some embodiments, as shown in FIG. 6, the second cooling plate 234 includes a conduit 610 disposed in the one or more second coolant channels 344. The conduit 610 may be press fit or otherwise coupled or held within the one or more second coolant channels 344. In some embodiments, the one or more second coolant channels 344 may be enclosed within the second cooling plate 234 and the conduit 610 may or may not be needed.

In some embodiments, the second cooling plate 234 is coupled to at least two sides of the chamber body 101. In some embodiments, the second cooling plate 234 comprises a side plate 604 coupled to the pump side 101A and a lower plate 608 extending from the side plate 604 and coupled to the bottom wall 101D of the chamber body 101. The multiple side design of the second cooling plate 234 advantageously enhances cooling of the pump side 101A, which is coupled to the pump 123 during use.

In some embodiments, the one or more second coolant channels 344 are disposed in the side plate 604 and the lower plate 608. The one or more second coolant channels 344 in the side plate 604 extend about the pump port 153 of the pump side 101A. In some embodiments, the second cooling plate 234 extends only partially about the pump port 153. In some embodiments, the second cooling plate 234 includes an inlet 622 and an outlet 628, with the one or more second coolant channels 344 at least partially defining a flow path from the inlet 622 to the outlet 628. In some embodiments, the second cooling plate 234 includes a second outlet 624 in the side plate 604 and a second inlet 626 in the lower plate 608.

In some embodiments, a flow path through the second cooling plate 234 extends from the inlet 622 to the second outlet 624 to the second inlet 626 to the outlet 628. In some embodiments, the flow path may be reversed. In some embodiments, the conduit 610 extends from the inlet 622 to the outlet 628. The conduit 610 may extend through the one or more second coolant channels 344 entirely or partially extends through the one or more second coolant channels 344. For example, one or more bends 615 of the conduit 610 may be disposed outside of the one or more second coolant channels 344.

Figure 4:
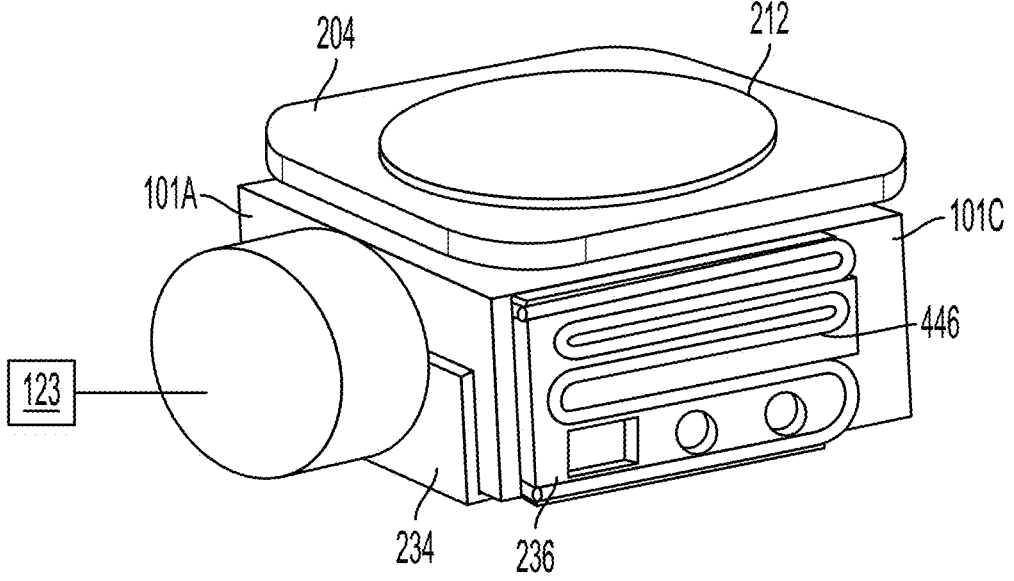
FIG. 4 depicts a schematic isometric view of a process chamber in accordance with at least some embodiments of the present disclosure.

FIG. 4 depicts a schematic isometric view of a process chamber 100 in accordance with at least some embodiments of the present disclosure. The third cooling plate 236 coupled to the shutter side 101C includes one or more third coolant channels 446. FIG. 7 depicts an isometric view of the third cooling plate 236 in accordance with at least some embodiments of the present disclosure. In some embodiments, as shown in FIG. 7, the third cooling plate 236 includes a conduit 710 disposed in the one or more third coolant channels 446. The conduit 710 may be press fit or otherwise coupled or held within the one or more third coolant channels 446. In some embodiments, the one or more third coolant channels 246 may be enclosed within the third cooling plate 236 and the conduit 710 may or may not be needed.

The third cooling plate 236 may include one or more cutouts 708 to accommodate for access to or connections with the chamber body 101. The conduit 710 may extend entirely the one or more third coolant channels 446 entirely or partially extends through the one or more third coolant channels 446. For example, one or more bends 715 of the conduit 710 may be disposed outside of the one or more third coolant channels 446.

The one or more third coolant channels 446 of the third cooling plate 236 may include an inlet 722 and an outlet 732 to define a flow path therethrough. In some embodiments, the inlet 722 and the outlet 732 are disposed along a same side of the third cooling plate 236. In some embodiments, the flow through the inlet 722 and the outlet 732 may be reversed.

In some embodiments, similar to as discussed above with respect to the first cooling plate 232, the one or more second coolant channels 344 and the one or more third coolant channels 446 may be enclosed within the second cooling plate 234 and the third cooling plate 236, respectively, and configured to flow a coolant therethrough. For example, the one or more second coolant channels 344 and the one or more third coolant channels 446 may be drilled or suitably machined into the respective cooling plates Referring back to FIGS. 2 and 3, in some embodiments, the one or more first coolant channels 242, the one or more second coolant channels 344, and the one or more third coolant channels 446 are fluidly coupled together. For example, the one or more first coolant channels 242 may be coupled to the one or more second coolant channels 344 via a first conduit 262. In some embodiments, a second conduit 264 couples the one or more second coolant channels 344 to the one or more third coolant channels 446. In some embodiments, two or more of the one or more first coolant channels 242, the one or more second coolant channels 344, and the one or more third coolant channels 446 are fluidly independent.

In embodiments where the one or more first coolant channels 242, the one or more second coolant channels 344, and the one or more third coolant channels 446 are formed within each respective cooling plate, the first conduit 262 extends from a respective outlet of the first cooling plate 232 to a respective inlet of the second cooling plate 234 and the second conduit 264 extends from a respective outlet of the one or more second coolant channels 344 to a respective inlet of the one or more third coolant channels 446.

In some embodiments, the one or more coolant channels 216 of the top plate 204 are fluidly coupled to the conduit 610. In some embodiments, the one or more coolant channels 216 of the top plate 204 are fluidly coupled to at least one of the one or more first coolant channels 242, the one or more second coolant channels 344, and the one or more third coolant channels 446. For example, a third conduit 266 may couple the one or more third coolant channels 446 to the one or more coolant channels 216 of the top plate 204. In some embodiments, a flow path extends from the top plate 204 to the first cooling plate 232 to the second cooling plate 234 to the third cooling plate 236 back to the top plate 204. However, the flow path may be reversed or pass through the first cooling plate 232, the second cooling plate 243, and the third cooling plate 236 through any suitable order and flow path.

In some embodiments, a body 292 of the first cooling plate 232, a body 294 of the second cooling plate 234, and a body 296 of the third cooling plate 236 is substantially made of aluminum. In some embodiments, at least one of the first cooling plate 232, the second cooling plate 234, and the third cooling plate 236 includes a gasket 280 to enhance thermal conduction. In some embodiments, the gasket 280 comprises a flat sheet of material affixed to a respective cooling plate or sandwiched between a respective cooling plate and wall of the chamber body 101. In some embodiments, the gasket 280 comprises graphite, for example, semiconductor grade graphite. In some embodiments, the gasket 280 is made of a combination of tin and indium. The gasket 280 is generally is disposed on a side facing the chamber body 101 to enhance thermal conductance. In some embodiments, only the first cooling plate 232 and the second cooling plate 234 include the gasket 280.

FIG. 8 depicts a cross-sectional side view of a portion of a first cooling plate 232 in accordance with at least some embodiments of the present disclosure. In some embodiments, the gasket 280 comprises a first layer 810 coupled to the body 292. In some embodiments, the gasket 280 comprises a second layer 820 coupled to the first layer 810 on a side opposite the body 802. In some embodiments, the first layer 810 is made of a metal, such as indium. In some embodiments, the second layer 820 is made of a metal, such as tin. In some embodiments, the first layer 810 is wider than the second layer 820. In some embodiments, the first layer 810 is about 0.08 to about 0.15 inches thick. In some embodiments, the second layer 820 is about 0.02 to about 0.06 inches thick. While the first cooling plate 232 is shown in FIG. 8, the second cooling plate 234 and the third cooling plate 236 may include the gasket 280. In some embodiments, the one or more first coolant channels 242 may be enclosed within the first cooling plate 232. The one or more first coolant channels 242 may be enclosed via additional material 830. The additional material 830 may be part of the body 292, for example, when the one or more first coolant channels 242 are formed via drilling through the body 292. In some embodiments, the additional material 830 may be a separate part fit into a front opening 840 of the one or more first coolant channels 242.

While the foregoing is directed to embodiments of the present disclosure, other and further embodiments of the disclosure may be devised without departing from the basic scope thereof.

The invention claimed is:

1. A process chamber, comprising:
   a chamber body defining an interior volume therein, the chamber body having a first chamber wall on a view port side having an opening configured as a view port, a second chamber wall on a pump side having a pump port, and a third chamber wall on a shutter side opposite the view port side, wherein the view port side, the pump side, and the shutter side are all different sides of the chamber body;
   a first cooling plate coupled to the first chamber wall and having one or more first coolant channels;

a second cooling plate coupled to the second chamber wall and having one or more second coolant channels; and a third cooling plate coupled to the third chamber wall and having one or more third coolant channels.

2. The process chamber of claim 1, further comprising at least one of:

one or more conduits extending through the one or more first coolant channels to the one or more second coolant channels to the one or more third coolant channels; or a first conduit coupling the one or more first coolant channels to the one or more second coolant channels and a second conduit coupling the one or more second coolant channels to the one or more third coolant channels.

3. The process chamber of claim 1, further comprising a top plate coupled to an upper surface of the chamber body, wherein the top plate includes one or more coolant channels.

4. The process chamber of claim 1, wherein the first cooling plate includes a port opening to accommodate the view port, and the one or more first coolant channels are substantially disposed about the port opening.

5. The process chamber of claim 1, wherein the second cooling plate comprises a side plate coupled to the pump side and a lower plate extending from the side plate and coupled to a bottom wall of the chamber body.

6. The process chamber of claim 5, wherein the one or more second coolant channels are disposed in the side plate and the lower plate.

7. The process chamber of claim 1, wherein at least one of the first cooling plate, the second cooling plate, and the third cooling plate includes a gasket to enhance thermal conduction.

8. The process chamber of claim 7, wherein the gasket comprises a first layer made substantially of tin and a second layer coupled to the first layer and made substantially of indium.

9. The process chamber of claim 1, further comprising:

a substrate support disposed in the interior volume, the substrate support having one or more heating elements configured to heat the substrate support to 700 degrees Celsius or higher during a physical vapor deposition (PVD) process.

10. A process chamber, comprising:

a chamber body defining an interior volume therein, the chamber body having a view port side having an opening configured as a view port, a pump side having a pump port, and a shutter side opposite the view port side, wherein the pert view port side, the pump side, and the shutter side are all different sides of the chamber body;

a first cooling plate coupled to the view port side and having one or more first coolant channels and having a first conduit disposed therein;

a second cooling plate coupled to the pump side and having one or more second coolant channels and having a second conduit disposed therein; and a third cooling plate coupled to the shutter side and having one or more third coolant channels and having a third conduit disposed therein, wherein the first conduit extends to a first end of the second conduit and a second end of the second conduit extends to the third conduit.

11. The process chamber of claim 10, further comprising a top plate coupled to an upper surface of the chamber body, wherein the top plate includes one or more coolant channels that are fluidly coupled to the first conduit.

12. The process chamber of claim 10, wherein a body of the first cooling plate, a body of the second cooling plate, and a body of the third cooling plate is substantially made of aluminum.

13. The process chamber of claim 10, further comprising one or more chamber shields disposed in the interior volume and configured to reduce a temperature of the chamber body.

14. The process chamber of claim 10, wherein the first cooling plate and the second cooling plate include a gasket made of a combination of tin and indium disposed on a side facing the chamber body.

15. A process chamber, comprising:

a chamber body defining an interior volume therein, the chamber body having a first chamber wall on a view port side having an opening configured as a view port, a second chamber wall on a pump side having a pump port, and a third chamber wall on a shutter side opposite the view port side, wherein the view port side, the pump side, and the shutter side are all different sides of the chamber body;

a first cooling plate coupled to the first chamber wall and having one or more first coolant channels and having a first conduit disposed therein;

a second cooling plate coupled to the second chamber wall and having one or more second coolant channels and having a second conduit disposed therein;

a third cooling plate coupled to the third chamber wall and having one or more third coolant channels and having a third conduit disposed therein, wherein the first conduit extends to the second conduit and the second conduit extends to the third conduit;

a top plate coupled to an upper surface of the chamber body, wherein the top plate includes one or more coolant channels fluidly coupled to the first conduit; and a cryogenic pump coupled to the pump port.

16. The process chamber of claim 15, wherein the third cooling plate includes one or more cutouts for access with the chamber body.

17. The process chamber of claim 15, wherein the pump port is disposed on a sidewall of the chamber body.

18. The process chamber of claim 15, wherein at least one of the first cooling plate, the second cooling plate, and the third cooling plate includes a gasket made of a combination of tin and indium disposed on a side facing the chamber body to enhance thermal conductance.

19. The process chamber of claim 15, wherein the second cooling plate is coupled to at least two sides of the chamber body.

20. The process chamber of claim 15, wherein the process chamber is a physical vapor deposition chamber.

* * * * *